(12) United States Patent
Umeda (10) Patent No.: US 10,359,492 B2
(45) Date of Patent: Jul. 23, 2019

(54) MAGNETIC RESONANCE IMAGING APPARATUS WITH EDDY CURRENT CORRECTION USING MAGNETIC RESONANCE SIGNALS IN WHICH INFLUENCE OF METABOLITE IS SUPPRESSED

(71) Applicant: TOSHIBA MEDICAL SYSTEMS CORPORATION, Otawara-shi, Tochigi (JP)

(72) Inventor: Masaaki Umeda, Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 796 days.

(21) Appl. No.: 14/637,710

(22) Filed: Mar. 4, 2015

(65) Prior Publication Data
US 2015/0253411 A1 Sep. 10, 2015

(30) Foreign Application Priority Data
Mar. 7, 2014 (JP) .................................. 2014-44690

(51) Int. Cl.
*G01R 33/565* (2006.01)
*G01R 33/485* (2006.01)
(Continued)

(52) U.S. Cl.
CPC .... *G01R 33/56518* (2013.01); *G01R 33/4625* (2013.01); *G01R 33/485* (2013.01);
(Continued)

(58) Field of Classification Search
USPC .......................... 324/300–322; 600/407–435; 382/128–131
See application file for complete search history.

(56) References Cited

U.S. PATENT DOCUMENTS 4,885,542 A * 12/1989 Yao .................. G01R 33/56518
324/307
6,069,478 A * 5/2000 Hurd .................... G01R 33/485
324/300
(Continued)

FOREIGN PATENT DOCUMENTS

JP 2002-315732 10/2002
JP 2006-346055 12/2006

OTHER PUBLICATIONS

First Japanese office action dated Sep. 18, 2018, in Patent Application No. JP 2015-38156.

*Primary Examiner* — Melissa J Koval
*Assistant Examiner* — Tiffany A Fetzner
(74) *Attorney, Agent, or Firm* — Nixon & Vanderhye P.C.

(57) ABSTRACT

According to one embodiment, a magnetic resonance imaging apparatus includes an acquiring part and an analysis part. The acquiring part is configured to acquire magnetic resonance signals for an analysis by magnetic resonance spectroscopy. The analysis part is configured to perform correction processing of magnetic resonance signals for an eddy current correction and obtain a frequency spectrum of the magnetic resonance signals for the analysis by the eddy current correction using magnetic resonance signals after the correction processing. The correction processing removes an influence of a magnetic resonance signal component from a predetermined metabolite.

12 Claims, 7 Drawing Sheets

(51) Int. Cl.
*G01R 33/46* (2006.01)
*G01R 33/56* (2006.01)
*G01R 33/48* (2006.01)

(52) U.S. Cl.
CPC ...... *G01R 33/4828* (2013.01); *G01R 33/5607* (2013.01); *G01R 33/5608* (2013.01)

(56) References Cited

U.S. PATENT DOCUMENTS

| | | | | |
|---|---|---|---|---|
| 6,275,040 | B1* | 8/2001 | Zur | G01R 33/446 |
| | | | | 324/320 |
| 8,390,285 | B2* | 3/2013 | Fu | G01R 33/56518 |
| | | | | 324/307 |
| 9,194,841 | B2* | 11/2015 | Bhatia | G01N 27/44782 |
| 9,234,953 | B2* | 1/2016 | Labadie | G01R 33/4818 |
| 2009/0285463 | A1* | 11/2009 | Otazo | G06T 3/4053 |
| | | | | 382/131 |
| 2010/0272337 | A1* | 10/2010 | Shirai | G01R 33/485 |
| | | | | 382/131 |
| 2011/0043203 | A1* | 2/2011 | Fu | G01R 33/485 |
| | | | | 324/307 |
| 2012/0313641 | A1* | 12/2012 | Labadie | G01R 33/4818 |
| | | | | 324/309 |
| 2015/0160316 | A1* | 6/2015 | Umeda | G01R 33/4828 |
| | | | | 324/309 |
| 2015/0253411 | A1* | 9/2015 | Umeda | G01R 33/56518 |
| | | | | 324/318 |
| 2016/0051188 | A1* | 2/2016 | Reddy | A61B 5/055 |
| | | | | 600/410 |

\* cited by examiner

MAGNETIC RESONANCE IMAGING APPARATUS WITH EDDY CURRENT CORRECTION USING MAGNETIC RESONANCE SIGNALS IN WHICH INFLUENCE OF METABOLITE IS SUPPRESSED

CROSS REFERENCES TO RELATED APPLICATIONS

This application is based upon and claims the benefit of priorities from Japanese Patent Application No. 2014-044690 filed on Mar. 7, 2014; the entire contents of which are incorporated herein by reference.

Further, the entire contents of Japanese Patent Application No. 2015-38156, filed on Feb. 27, 2015 are incorporated herein by reference.

FIELD

Embodiments described herein relate generally to an MRI (magnetic resonance imaging) apparatus.

BACKGROUND

The MRI apparatus is an imaging diagnostic apparatus which magnetically excites nuclear spins of an object set in a static magnetic field with RF (radio frequency) signals having the Larmor frequency and reconstructs an image based on MR (magnetic resonance) signals generated due to the excitation.

As one of image analysis methods in the MRI apparatus, MRS (magnetic resonance spectroscopy) is known. The MRS is a data analysis method for studying types and/or components of molecules in a living body, based on an amount of a chemical shift in a resonant frequency and intensities of MR signals.

An object of the present invention is to provide a magnetic resonance imaging apparatus which can improve an SNR (signal to noise ratio) of signals from target metabolites in MRS.

DETAILED DESCRIPTION

In general, according to one embodiment, a magnetic resonance imaging apparatus includes an acquiring part and an analysis part. The acquiring part is configured to acquire magnetic resonance signals for an analysis by magnetic resonance spectroscopy. The analysis part is configured to perform correction processing of magnetic resonance signals for an eddy current correction and obtain a frequency spectrum of the magnetic resonance signals for the analysis by the eddy current correction using magnetic resonance signals after the correction processing. The correction processing removes an influence of a magnetic resonance signal component from a predetermined metabolite.

Further, according to another embodiment, a magnetic resonance imaging apparatus includes an acquiring part and an analysis part. The acquiring part is configured to acquire magnetic resonance signals for an analysis by magnetic resonance spectroscopy and acquire magnetic resonance signals for an eddy current correction under a condition that a magnetic resonance signal component from a predetermined metabolite is suppressed. The analysis part is configured to obtain a frequency spectrum of the magnetic resonance signals for the analysis by the eddy current correction using the magnetic resonance signals for the eddy current correction.

A magnetic resonance imaging apparatus according to embodiments of the present invention will be described with reference to the accompanying drawings.

Figure 1:
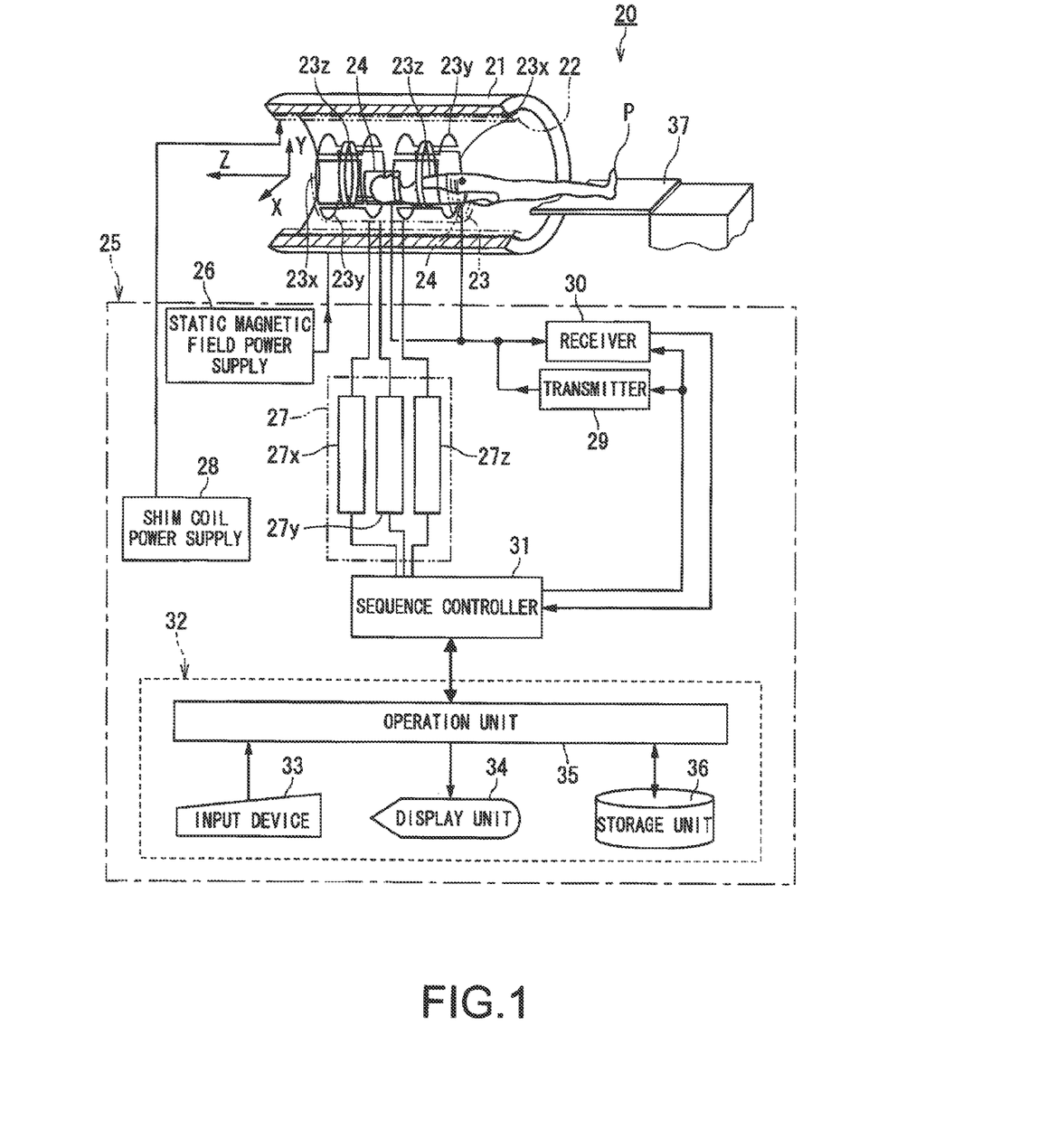
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a cylinder-shaped static field magnet 21, a shim coil 22, a gradient coil 23 and RF coils 24. The static field magnet 21 generates a static magnetic field. The shim coil 22 is arranged inside the static field magnet 21.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z, which is cylinder-shaped, is arranged inside the static field magnet 21. The gradient coil 23 has also a bed 37 in the area formed inside it which is an imaging area. The bed 37 supports an object P. The RF coils 24 include a WBC (whole body coil), which is built in a gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 transmits RF signals given from the transmitter 29 to the object P. The reception RF coil 24 receives MR signals generated due to nuclear spins inside the object P which are excited by the RF signals to give to the receiver 30.

The sequence controller 31 of the control system 25 communicates with the gradient power supply 27, the transmitter 29 and the receiver 30. The sequence controller 31 stores sequence information describing control information needed in order to drive the gradient power supply 27, the transmitter 29 and the receiver 30, and generates gradient magnetic fields Gx, Gy and Gz in the X, Y and Z directions and RF signals by driving the gradient power supply 27, the transmitter 29 and the receiver 30 according to a predetermined stored sequence. The above-described control information includes motion control information, such as intensities, application durations and application timings of electric current pulses which should be applied to the gradient power supply 27.

The sequence controller 31 is also configured to give raw data to the computer 32. The raw data, which are complex-valued data, are generated by the receiver 30 performing detection and A/D (analog to digital) conversion of MR signals.

The transmitter 29 gives RF signals to the RF coil 24 in accordance with control information provided from the sequence controller 31. Meanwhile, the receiver 30 performs detection, necessary signal processing and A/D conversion of MR signals given from the RF coils 24 to generate raw data which are digitized complex-valued data. The generated raw data are given from the receiver 30 to the sequence controller 31.

The computer 32 has various functions by the operation unit 35 executing programs stored in the storage unit 36 of the computer 32. Alternatively, specific circuits having various functions may be provided to the magnetic resonance imaging apparatus 20, instead of at least a part of the computer programs.

Figure 2:
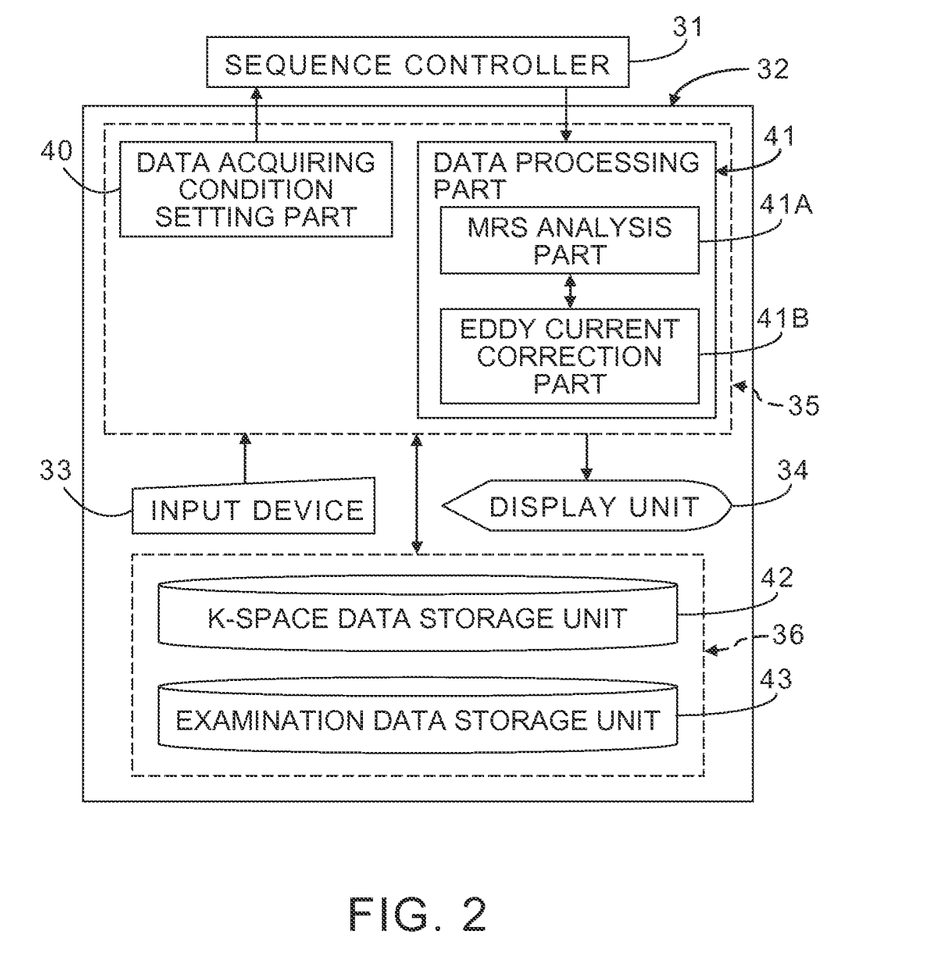
FIG. 2 is a functional block diagram of the computer shown in FIG. 1.

FIG. 2 is a functional block diagram of the computer 32 shown in FIG. 1.

The operation unit 35 of the computer 32 functions as a data acquiring condition setting part 40 and a data processing part 41 by executing programs stored in the storage unit 36. The data processing part 41 has an MRS analysis part 41A and an eddy current correction part 41B. The storage unit 36 functions as a k-space data storage unit 42 and an examination data storage unit 43. Note that, the computer 32 is also composed by electronic circuits. Therefore, it can be said that the data acquiring condition setting part 40 and the data processing part 41 can consist of at least one circuit, assuming that the computer 32 is a type of circuit.

The data acquiring condition setting part 40 sets data acquiring conditions for an MRS analysis based on direction information from the input device 33 and outputs the set data acquiring conditions to the sequence controller 31. As the data acquiring conditions for an MRS analysis, pulse sequences with application of a fat saturation pulse and/or a water saturation pulse can be set. Furthermore, data acquiring conditions for repeatedly acquiring MR signals multiple times for averaging can be set in order to improve an SNR of MRS analysis data.

In an MRS analysis, eddy current correction processing which corrects influence by an eddy current is performed to acquired data. Therefore, in addition to data acquiring conditions for acquiring data themselves for an MRS analysis, data acquiring conditions for acquiring correction data used for an eddy current correction are set as the data acquiring conditions for the MRS analysis.

Figure 3:
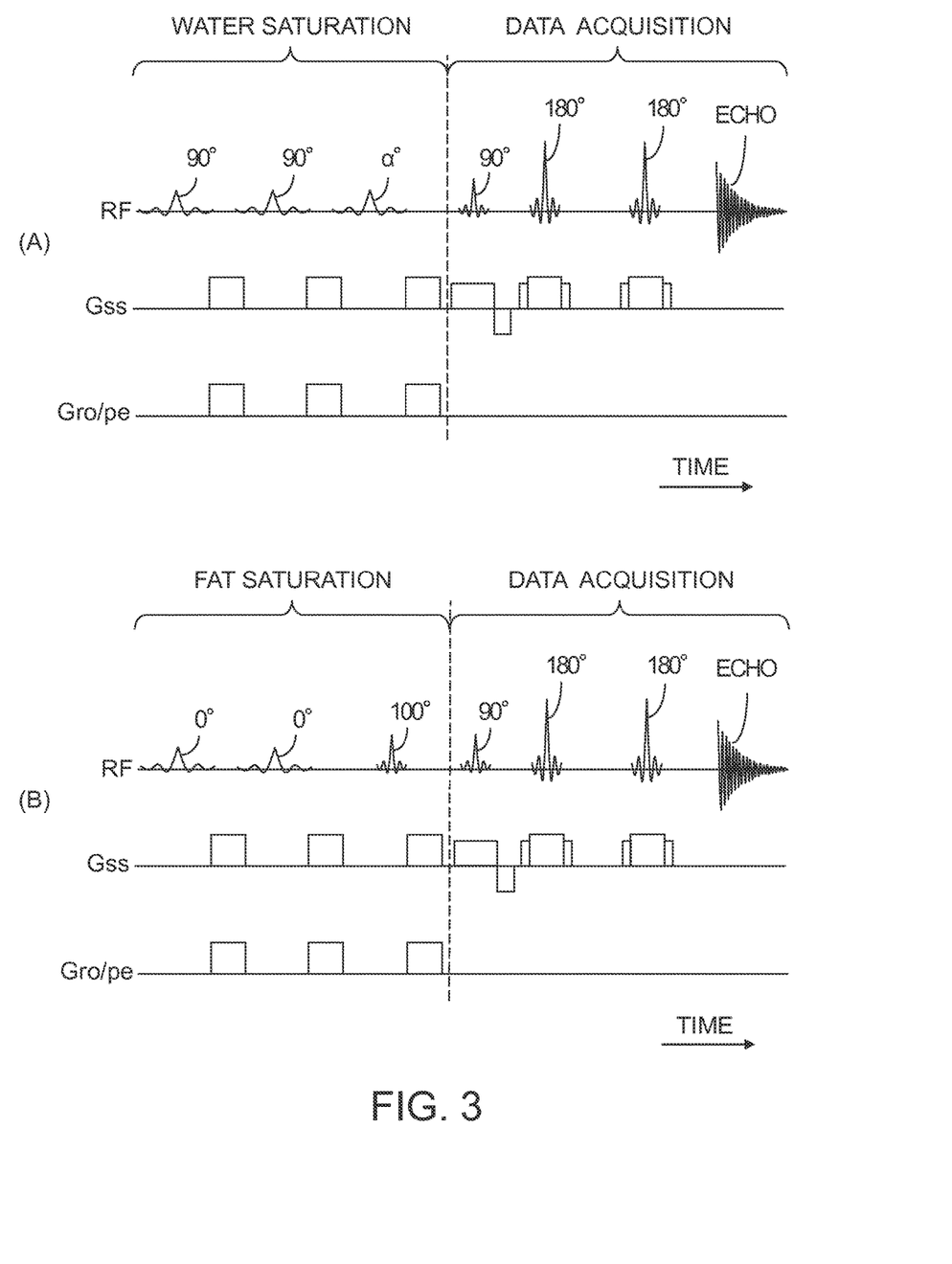
FIG. 3 shows an example of pulse sequences for an MRS analysis.

FIG. 3 shows an example of pulse sequences for an MRS analysis.

In each of (A) and (B) of FIG. 3, RF shows RF pulses and MR echo signals, Gss shows gradient magnetic field pulses in an SS (slice selection) direction, and Gro/pe shows gradient magnetic field pulses in an RO (readout) direction and a PE (phase encode) direction, respectively. FIG. 3 (A) shows an example of a pulse sequence for acquiring data for an MRS analysis while FIG. 3 (B) shows an example of a pulse sequence for acquiring correction data for an eddy current correction.

A pulse sequence for acquiring data for an MRS analysis can be created with a water saturation sequence and a data acquisition sequence. The water saturation sequence can be set as a sequence by which an RF water saturation pulse for suppressing water signals, which are MR signals from water, and gradient magnetic field pulses for encodes are applied. In an example shown in FIG. 3 (A), a CHESS (chemical shift selective) pulse consisting of three RF pulses is used as a water saturation pulse. Meanwhile, the data acquisition sequence can be set as a sequence by which a 90° RF excitation pulse and 180° RF inversion pulses are applied with applications of gradient magnetic field pulses for slice selections.

When RF pulses and gradient magnetic field pulses are applied according to the water saturation sequence and the data acquisition sequence as described above, MR echo signals for an MRS analysis can be acquired.

Mainly in case of a breast examination with coherent averaging or the like, it may be diagnostically preferred to acquire MR signals for an MRS analysis under a condition that the saturation effect of water signals has been reduced. FIG. 3 (A) shows an example case of acquiring MR signals for an MRS analysis by reducing the water saturation effect. In other words, FIG. 3 (A) shows an example of acquiring MR signals for an MRS analysis under a condition that MR signal component from water is suppressed incompletely. Specifically, in the water saturation sequence, each FA (flip angle) of the first and the second RF pulses is 90° while the FA of the third RF pulse is adjusted to an angle α which is smaller than 90° so that water signals are not suppressed excessively.

On the other hand, a pulse sequence for acquiring correction data for an eddy current correction can be created with a fat saturation sequence and a correction data acquisition sequence. The fat saturation sequence can be set as a sequence by which a fat saturation pulse for suppressing fat signals, which are MR signals from fat, and gradient magnetic field pulses for encodes are applied. Meanwhile, the correction data acquisition sequence can be set as a sequence similar to the data acquisition sequence for acquiring data for an MRS analysis shown in FIG. 3 (A).

The fat saturation sequence can be made by changing each FA of the RF pulses which are included in the CHESS pulse shown in FIG. 3 (A). Specifically, the fat saturation sequence with application of a fat saturation pulse for suppressing fat signals can be made by setting each FA of the first and the second RF pulses to 0° so as to turn off the RF pulses, and the FA of the third RF pulse to 100° or the like.

Note that, although a frequency band of RF pulses used as a water saturation pulse is usually approximately 1-2 [ppm], a frequency band of RF pulses used as a fat saturation pulse is appropriate to be a band of approximately 5 [ppm] whose center is the resonant frequency of fat signals.

When RF pulses and gradient magnetic field pulses are applied according to the fat saturation sequence and the correction data acquisition sequence as described above, MR echo signals, in which fat signals have been suppressed, for an eddy current correction can be acquired. Then, deterioration in SNRs of MR echo signals for an MRS analysis, which have been acquired without suppressing water signals enough, can be reduced when the MR echo signals for the MRS analysis is subjected to an eddy current correction using the MR echo signals for the eddy current correction.

Note that, although an example shown in FIG. 3 uses CHESS pulses as a water saturation pulse and a fat saturation pulse, arbitrary frequency selective metabolite saturation pulses, such as a SPAIR (SPectral Attenuated Inversion Recovery) pulse, may be used.

Alternatively, MR signal component from an unnecessary metabolite, such as silicone, other than fat may be suppressed, instead of suppressing the MR signal component from fat or in addition to suppressing the MR signal component from fat, in a pulse sequence for acquiring correction data for an eddy current correction. That is, MR signals for an eddy current correction can be acquired with suppressing unnecessary MR signals from one desired metabolite or plural desired metabolites, which may lead to deterioration in SNRs of MR signals for an MRS analysis due to the eddy current correction.

When three RF pulses are applied in a metabolite saturation sequence as exemplified in FIG. 3 (B), for example, a condition to suppress other metabolite signals in addition to fat signals can be set. That is, RF pulses included in a metabolite saturation sequence can be used for suppressing unnecessary MR signals from plural metabolites different from each other.

As a more specific example, an FA of the first RF pulse can be set to 0° so as to turn off the first RF pulse, a frequency band of the second RF pulse can be set as a band centering on a resonant frequency of a metabolite in the higher frequency side than the resonant frequency of water by approximately 8 [ppm], and a frequency band of the third RF pulse can be set as a band centering on the resonant frequency of fat in the higher frequency side than the resonant frequency of water by approximately 1 [ppm]. Thereby, MR signals for an eddy current correction can be acquired in the state that both fat signals and metabolite signals have been suppressed.

Similarly, it is possible to set conditions under which MR signals from a metabolite whose resonant frequency is in the higher frequency side than the resonant frequency of water and MR signals from a metabolite whose resonant frequency is in the lower frequency side than the resonant frequency of water are suppressed by frequency selective RF pulses, such as CHESS pulses, respectively.

Figure 4:
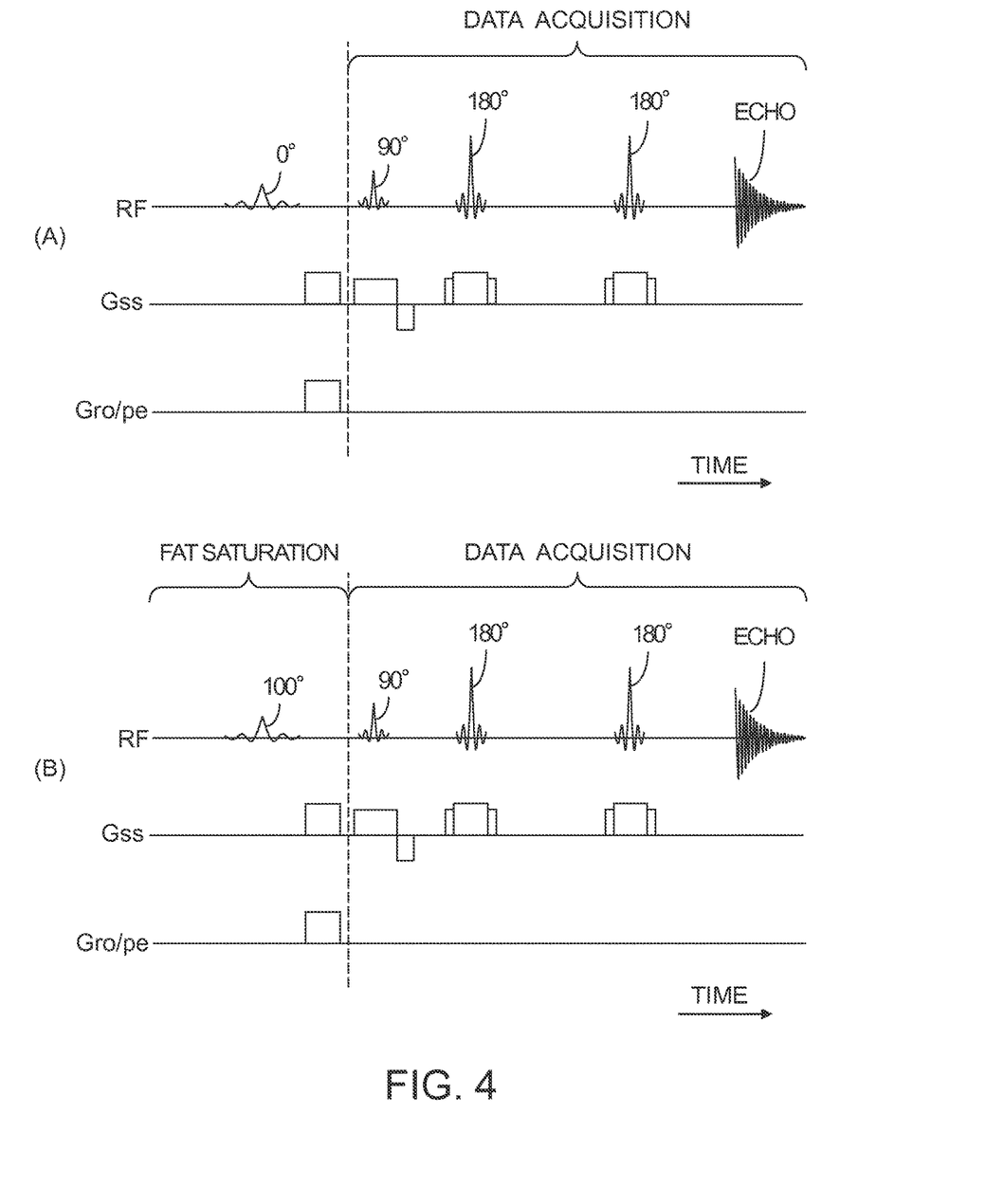
FIG. 4 shows another example of pulse sequences for an MRS analysis.

FIG. 4 shows another example of pulse sequences for an MRS analysis.

In each of (A) and (B) of FIG. 4, RF shows RF pulses and MR echo signals, Gss shows gradient magnetic field pulses in an SS direction, and Gro/pe shows gradient magnetic field pulses in an RO direction and a PE direction, respectively. FIG. 4 (A) shows another example of a pulse sequence for acquiring data for an MRS analysis while FIG. 4 (B) shows another example of a pulse sequence for acquiring correction data for an eddy current correction.

Mainly in case of a liver examination or the like, it may be diagnostically preferred to acquire MR signals for an MRS analysis under conditions without water saturation. FIG. 4 (A) shows an example case of acquiring MR signals for an MRS analysis under conditions without water saturation. Specifically, in the pulse sequence for acquiring data for an MRS analysis shown in FIG. 4 (A), a water saturation pulse is not applied before a data acquisition sequence, which is similar to the data acquisition sequence shown in FIG. 3 (A).

When MR signals for an MRS analysis are acquired without water saturation as described above, it is preferable to set a sequence with an application of a frequency selective fat saturation RF pulse as a pulse sequence for acquiring correction data for an eddy current correction, as shown in FIG. 4 (B). That is, a fat saturation sequence and a correction data acquisition sequence can compose a pulse sequence for acquiring correction data.

Then, MR echo signals for an eddy current correction, in which fat signals have been suppressed, can be acquired. Accordingly, when MR signals for an MRS analysis acquired without suppressing water signals are subjected to an eddy current correction using the MR signals for the eddy current correction, deterioration in SNRs of the MR signals for the MRS analysis can be reduced.

Note that, when a pulse sequence for acquiring correction data is set as shown in FIG. 4 (B), a pulse sequence for acquiring data for an MRS analysis can be simply set by setting the FA of the fat saturation RF pulse to 0° so as to turn OFF the fat saturation RF pulse as shown in FIG. 4 (A).

Moreover, the necessary number of frequency selective metabolite saturation RF pulses each having a necessary frequency band can be applied so as to suppress unnecessary MR signals from plural metabolites in MR signals for an eddy current correction, similarly to a case of the pulse sequence exemplified in FIG. 3. Specifically, a pulse sequence for acquiring correction data can consist of a metabolite saturation sequence, which suppresses unnecessary metabolite signals by applying a single frequency selective metabolite saturation RF pulse of which the center frequency is a resonant frequency of a single metabolite other than water or plural frequency selective metabolite saturation RF pulses of which the center frequencies are resonant frequencies of plural metabolites other than water, and a correction data acquisition sequence.

Although each of a condition that the MR signal component from water is suppressed incompletely as exemplified in FIG. 3 (A) and a condition that the MR signal component from water is not suppressed as exemplified in FIG. 4 (A) is a condition that the MR signal component from water remains, MR signals for an MRS analysis may be acquired under a condition that the MR signal component from water is suppressed completely. When data are acquired using the pulse sequence shown in FIG. 3 (A), for example, a condition that the MR signal component from water is suppressed completely can be set as a data acquiring condition by setting each FA of the first to the third RF pulses in the water saturation sequence to 90°. Note that, "completely" means that the condition is not a condition for incompletely suppressing MR signal component but a condition for suppressing MR signal component ideally completely. Therefore, MR signal component itself is not always suppressed completely when the suppression condition is ideally complete.

The data processing part 41 obtains examination information based on MR signals for an MRS analysis acquired under data acquiring conditions set as a pulse sequence in the data acquiring condition setting part 40. Specifically, a frequency spectrum of MR signals for an MRS analysis is obtained as examination information by data analysis processing including an FT (Fourier transform) and eddy current correction processing of the MR signals for the MRS analysis.

The frequency spectrum of MR signals obtained as examination information can be displayed on the display unit 34 as MRS analysis data. The frequency spectrum of MR signals can also be stored in the examination data storage unit 43 as MRS analysis data.

The MRS analysis part 41A obtains a frequency spectrum of MR signals for an MRS analysis as MRS analysis data by analysis processing including an FT of the MR signals. In addition, the MRS analysis part 41A performs necessary processing, such as averaging, as preprocessing or post-processing of the MRS analysis processing.

The eddy current correction part 41B performs eddy current correction processing of MR signals for an MRS analysis, using MR signals for an eddy current correction as data for a correction. MR signals for an eddy current correction can be acquired by a pre-scan using a sequence as exemplified in FIG. 3 (B) or FIG. 4 (B). Note that, MR signals for an MRS analysis acquired by a sequence as exemplified in FIG. 3 (A) or FIG. 4 (A) may also be used as MR signals for an eddy current correction. That is, an eddy current correction may be performed using self-data.

Furthermore, the eddy current correction part 41B is configured to perform correction processing of data for a correction in order to remove influences of MR signal components from predetermined unnecessary metabolites, such as fat signals and/or silicone signals, other than water signals and perform eddy current correction processing of MR signals for an MRS analysis using the data for the correction after the correction processing, from which the influences of the MR signal components from the predetermined metabolites have been removed. Although correction processing for removing an influence of fat signals from MR signals for an eddy current correction will be mainly described below, it is similar for correction processing for removing influences of MR signal components from unnecessary metabolites, such as silicone signals, other than water signals, from MR signals for an eddy current correction.

Figure 5:
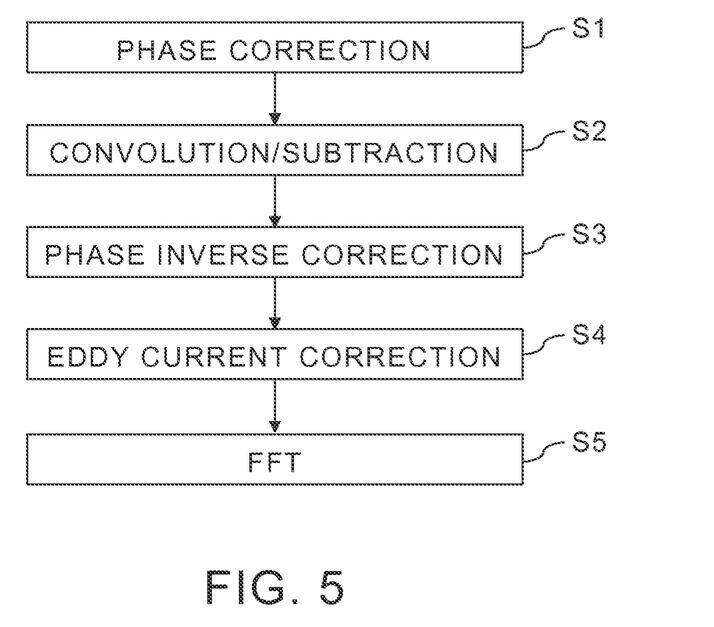
FIG. 5 is a flow chart showing an example of a flow of MRS analysis processing including an eddy current correction in the data processing part shown in FIG. 2.

FIG. 5 is a flow chart showing an example of a flow of MRS analysis processing including an eddy current correction in the data processing part 41 shown in FIG. 2.

Firstly, in step S1, MR signals acquired as data for an eddy current correction is subjected to a phase correction so that the center frequency of the MR signals for the eddy current correction becomes the center frequency of fat signals included in the MR signals for the eddy current correction. When the MR signal for the eddy current correction, after the phase correction, at a data acquisition point t (t=1, 2, . . . , N) is represented by refPh(t), the phase correction is expressed by expression (1).

$$refPh(t) = ref(t)\exp(2\pi t \Delta f \Delta t) \quad (1)$$

wherein, ref(t) represents the MR signal for the eddy current correction before the phase correction at the data acquisition point t, $\Delta f$ represents a difference in frequency between fat signals and water signals, and $\Delta t$ represents a time per data acquisition point t of MR signals, respectively. Under 1.5 [T] of a magnetic field, the difference in frequency between fat signals and water signals is −225 [Hz]. The time $\Delta t$ per data acquisition point t of MR signals is generally about $1 \times 10^{-3}$ [s].

Next, in step S2, processing for subtracting a convolution processing result in the time domain of the MR signals for the eddy current correction after the phase correction, from the original MR signals for the eddy current correction after the phase correction is performed. In the convolution processing, low frequency component is extracted from the MR signals for the eddy current correction after the phase correction. Therefore, the MR signals for the eddy current correction after the phase correction, from which fat signals corresponding to the low frequency component have been removed, are obtained by the processing for subtracting the convolution processing result.

The processing for calculating the MR signals refPhSub(t) for the eddy current correction, after the phase correction, from which fat signals have been removed is expressed by expression (2).

$$refPhSub(t) = refPh(t) - refPh(t) * G(t) \quad (2)$$

wherein, G(t) represents the Gaussian function used as a convolution filter in the time domain, and * represents the convolution operation, respectively.

Next, in step S3, a phase inverse correction is performed to cancel a phase correction amount having shifted by the phase correction for changing the center frequency of the MR signals for the eddy current correction into the center frequency of fat signals. That is, the phase inverse correction is performed to shift the center frequency of the MR signals for the eddy current correction, after the subtraction processing shown by expression (2), to the center frequency of water signals. This phase inverse correction processing allows obtaining the MR signals for the eddy current correction, of which the center frequency becomes the center frequency of water signals and from which fat signals have been removed.

The phase inverse correction processing is phase correction processing derived by inverting a sign of a correction amount of the phase correction processing in step S1. Therefore, an operation, by the phase inverse correction processing, for obtaining the MR signals refWat(t) for the eddy current correction, of which the center frequency becomes the center frequency of water signals and from which unnecessary fat signals have been removed, is expressed by expression (3).

$$refWat(t) = refPhSub(t)\exp(-2\pi t \Delta f \Delta t) \quad (3)$$

The above-mentioned processing shown from step S1 to step S3 is correction processing of the data for the eddy current correction, performed in the eddy current correction part 41B, in order to remove an unnecessary signal component. When the correction processing of the data for the eddy current correction has been completed, it becomes possible to perform the MRS analysis processing including the eddy current correction using the data for the eddy current correction, after the correction, from which the unnecessary signal component have been removed.

Therefore, in step S4, the eddy current correction processing of the MR signals for the MRS analysis is performed, in the eddy current correction part 41B, using the data for the eddy current correction after the correction. The eddy current correction is expressed by expression (4).

$$\text{Raw\_cor}(t) = \text{Raw}(t) \exp\{-j\varphi(t)\} \tag{4}$$

wherein, Raw_cor(t) represents the MR signal for the MRS analysis after the eddy current correction, Raw(t) represents the MR signal for the MRS analysis before the eddy current correction, and φ(t) represents a phase of the MR signal refWat(t) for the eddy current correction after the correction, respectively.

As shown by expression (4), the eddy current correction is a division of the MR signal refWat(t) for the eddy current correction, at each data acquisition point t in the time domain, by the phase φ(t). The phase φ(t) of the MR signal refWat(t) for the eddy current correction after the correction can be obtained by expression (5).

$$\varphi(t) = \text{Arctan}\{Im\_refWat(t), Re\_refWat(t)\} \tag{5}$$

wherein, Im_refWat(t) represents the imaginary part of the MR signal refWat(t) for the eddy current correction after the correction, and Re_refWat(t) represents the real part of the MR signal refWat(t) for the eddy current correction after the correction, respectively.

After the eddy current correction, in step S5, the MRS analysis processing is performed in the MRS analysis part 41A. Specifically, the MR signals Raw_cor(t) for the MRS analysis after the eddy current correction are subjected to an FFT (fast FT). As a result, a frequency spectrum of the MR signals Raw_cor(t) after the eddy current correction can be obtained as the MRS analysis data.

Note that, correction processing for removing unnecessary metabolite signals other than fat signals, from MR signals for an eddy current correction may also be performed. In that case, what is necessary is to perform phase correction processing for changing the center frequency of MR signals for an eddy current correction to a center frequency of metabolite signals which are removal targets, and subsequently, to perform processing for subtracting low frequency component from the MR signals for the eddy current correction. Therefore, desired plural metabolite signal sets can be removed from MR signals for an eddy current correction by repeating the correction processing from step S1 to step S3 multiple times, with changing a phase correction amount according to center frequencies of the metabolite signal sets which are removal targets.

That is, not only influence of MR signal component from a predetermined metabolite, but also influence of MR signal component from another unnecessary metabolite, which is different from the predetermined metabolite, can be further removed from MR signals for an eddy current correction by the correction processing. As a specific example, influences of fat signals and silicone signals can be removed from MR signals for an eddy current correction by the correction processing as described above.

Figure 6:
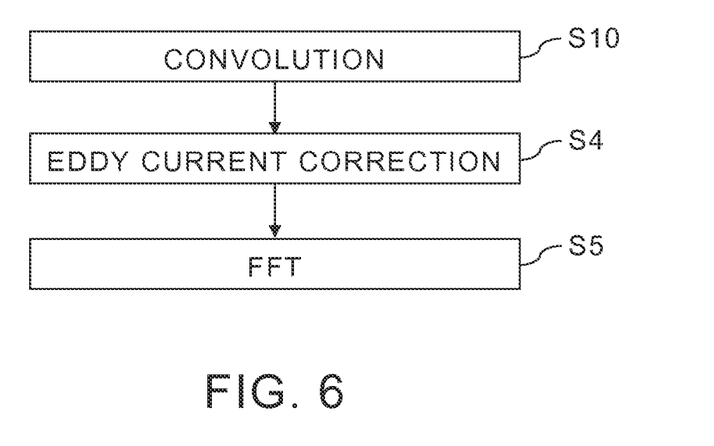
FIG. 6 is a flow chart showing another example of a flow of MRS analysis processing including an eddy current correction in the data processing part shown in FIG. 2.

FIG. 6 is a flow chart showing another example of a flow of MRS analysis processing including an eddy current correction in the data processing part 41 shown in FIG. 2. In FIG. 6, same signs are attached with steps similar to those in FIG. 5, and detailed explanations thereof are omitted.

In step S10, convolution processing in the time domain can also be performed as a correction for removing unnecessary fat signal component from data for an eddy current correction. The convolution processing for obtaining the MR signal refWat(t) for the eddy current correction at each data acquisition point t after the correction, based on the MR signal ref(t) for the eddy current correction before the correction, is expressed by expression (6).

$$refWat(t) = ref(t) * G(t) \tag{6}$$

wherein, G(t) represents the Gaussian function used as a convolution filter in the time domain, and * represents the convolution operation, respectively.

When the convolution processing shown by expression (6) is performed, water signals corresponding to low frequency component can be extracted from the MR signals ref(t) for the eddy current correction before the correction. Therefore, the extracted water signals can be used as the MR signals refWat(t) for the eddy current correction after the correction. Thus, the MR signals refWat(t) for the eddy current correction which consist only of the water signals can be obtained.

When the MR signals refWat(t) for the eddy current correction after the correction are obtained, a frequency spectrum of the MR signals Raw_cor(t) after the eddy current correction can be obtained by the eddy current correction in step S4 and the FFT in step S5, similarly to the example shown in FIG. 5.

Note that, the above-mentioned MRS analysis processing with an eddy current correction can be similarly performed not only in single voxel imaging but in multi-voxel imaging.

Having the functions as mentioned above, the data acquiring condition setting part 40 of the computer 32 functions as an acquiring part configured to acquire MR signals for an analysis by MRS and acquire MR signals for an eddy current correction of the MR signals for the analysis under a condition that MR signal component from a predetermined metabolite is suppressed, from an object, by cooperating with hardware, such as the static field magnet 21, the shim coil 22, the gradient coil 23 and the RF coils 24. However, the acquiring part may be configured by other elements so long as similar functions are provided.

In this acquiring part, MR signals for an analysis can be acquired under a condition that MR signal component from the first metabolite, such as water, remains or a condition that the MR signal component from the first metabolite is completely suppressed. The condition that the MR signal component from the first metabolite remains is a condition that the MR signal component from the first metabolite is suppressed incompletely or a condition that the MR signal component from the first metabolite is not suppressed. Meanwhile, the acquiring part can acquire MR signals for an eddy current correction under a condition that MR signal component from the second metabolite, such as fat or silicone, which is different from the first metabolite, is suppressed.

MR signals for an eddy current correction can also be acquired under a condition that MR signal component from the third metabolite, which is different from the first and second metabolites, is further suppressed. Instead of acquiring MR signals for an eddy current correction from an object O in addition to acquiring MR signals for an analysis, the MR signals for the analysis may also be used as MR signals for an eddy current correction.

On the other hand, the data processing part 41 of the computer 32 has a function as an analysis part configured to obtain a frequency spectrum of MR signals for an analysis, by processing including an eddy current correction of the MR signals for the analysis based on MR signals for an eddy current correction. Especially, the data processing part 41 as the analysis part is configured to perform correction processing of MR signals for an eddy current correction in order to remove an influence of MR signal component from a predetermined metabolite, and obtain a frequency spectrum of MR signals for an analysis by processing including the eddy current correction using the MR signals for the eddy current correction after the correction processing.

The above-mentioned correction processing may be processing for removing an influence of MR signal component from the second metabolite, such as fat, which is different from the first metabolite, such as water. In this case, a phase correction, subtraction processing and a phase inverse correction can be performed as the correction processing. The phase correction shifts the center frequency of MR signals for an eddy current correction to the center frequency of MR signal component from the second metabolite. The subtraction processing extracts and subtracts the MR signal component from the second metabolite, from the MR signals for the eddy current correction after the phase correction. The phase inverse correction shifts the center frequency of the MR signals for the eddy current correction after the subtraction processing, to the center frequency of MR signal component from the first metabolite. Alternatively, as the above-mentioned correction processing, processing for extracting MR signal component from the first metabolite, from MR signals for an eddy current correction, and using the extracted MR signal component from the first metabolite as the MR signals for the eddy current correction after the correction processing may be performed.

Furthermore, MR signal component from the third metabolite, which is different from the first and the second metabolites, may be removed from MR signals for an eddy current correction in the correction processing.

Next, an operation and action of the magnetic resonance imaging apparatus 20 will be described.

Figure 7:
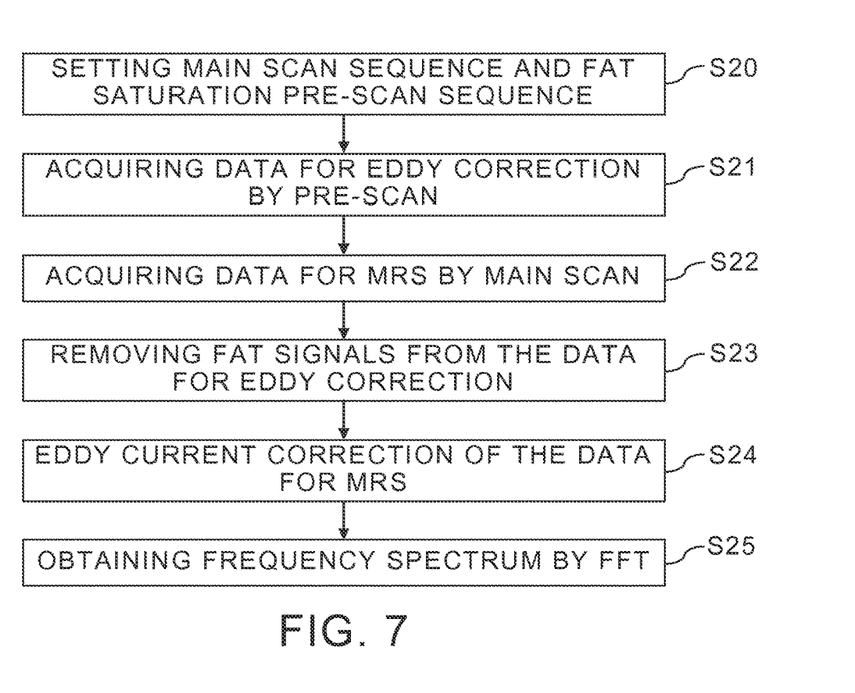
FIG. 7 is a flow chart showing an example of an operation of the magnetic resonance imaging apparatus shown in FIG. 1.

FIG. 7 is a flow chart showing an example of an operation of the magnetic resonance imaging apparatus 20 shown in FIG. 1.

Firstly, an object P is set on the bed 37, and the static magnetic field is generated in an imaging area of the magnet 21 (a superconducting magnet), for the static magnetic field, excited by the static magnetic field power supply 26. Further, the shim coil power supply 28 supplies current to the shim coil 22, thereby uniformizing the static magnetic field generated in the imaging area.

Next, in step S20, a sequence for a main scan which acquires MR signals for an MRS analysis and a sequence for a pre-scan which acquires MR signals for an eddy current correction with a fat saturation are set by the data acquiring condition setting part 40 as exemplified in FIG. 3 or FIG. 4. Specifically, a sequence by which the MR signal component from water remains or a sequence by which the MR signal component from water is completely suppressed is set as the sequence for the main scan. As the sequence which leaves the MR signal component from water, a sequence which performs a water saturation incompletely as exemplified in FIG. 3 (A) or a sequence which does not perform the water saturation as exemplified in FIG. 4 (A) is set. Furthermore, a metabolite saturation sequence which suppresses metabolite signals, such as silicone signals, other than the water signals and the fat signals may be set for the pre-scan.

Next, in step S21, the pre-scan is performed according to the sequence for the pre-scan. Thereby, the MR signals for the eddy current correction are acquired.

Specifically, data acquiring conditions, including the pulse sequence, are output to the sequence controller 31 from the data acquiring condition setting part 40. Then, the sequence controller 31 drives the gradient power supply 27, the transmitter 29, and the receiver 30 in accordance with the data acquiring conditions, thereby generating gradient magnetic fields in an imaging area having the set object P, and further generating RF signals from the RF coil 24.

Consequently, the RF coil 24 receives MR signals generated due to the nuclear magnetic resonance in the object P. Then, the receiver 30 receives the MR signals from the RF coil 24 and performs necessary signal processing of the MR signals. Subsequently, the receiver 30 outputs the MR signals to the computer 32 through the sequence controller 31.

Then, the MR signals output to the computer 32 are given to the eddy current correction part 41B as data for the eddy current correction. This data for the eddy current correction are data in which the fat signals have been suppressed.

Next, in step S22, the main scan is performed according to the sequence for the main scan. Thereby, the MR signals for the MRS analysis are acquired in a flow similar to that in the pre-scan. The acquired MR signals for the MRS analysis are given to the eddy current correction part 41B as a target of the eddy current correction. Note that, preprocessing of the eddy current correction of the MR signals for the MRS analysis is arbitrarily performed in the MRS analysis part 41A.

Next, in step S23, the eddy current correction part 41B performs a correction for removing an influence of the fat signals from the data for the eddy current correction. Thereby, the data for the eddy current correction, after the correction, from which the influence of the fat signals has been removed are generated.

As a specific example, the fat signals are removed from the data for the eddy current correction by processing including a phase correction as shown in step S1 to step S3 of FIG. 5. Note that, a correction for removing metabolite signals, such as silicone signals other than the fat signals may be performed by changing a phase correction amount, as necessary. Alternatively, the data for the eddy current correction consisting only of water signals may be obtained as data after the correction, by processing which extracts a low-frequency component of the data for the eddy current correction as shown in step S10 of FIG. 6. In this case, it is possible to remove influences of all the metabolite signals other than the water signals.

Next, in step S24, the eddy current correction part 41B performs the eddy current correction of the MR signals for the MRS analysis, using the data for the eddy current correction after the correction. The eddy current correction is a division of the MR signal for the MRS analysis at each data acquisition point, by a phase of the data for the eddy current correction after the correction as shown in expression (4).

Next, in step S25, the MRS analysis part 41A performs an FFT of the MR signals for the MRS analysis after the eddy current correction. Thereby, a frequency spectrum of the MR signals is obtained as MRS analysis data. When the MR signals for the MRS analysis have been acquired by a sequence by which the MR signal component from the water remains, the frequency spectrum is generated based on MR signals derived by the eddy current correction of MR signals in which the water saturation effect is incomplete or MR signals without the water saturation effect.

However, the MR signals used for generating the frequency spectrum have been subjected to the eddy current correction using the fat saturated data for the eddy current correction which also had been subjected to the correction for removing the unnecessary metabolite signals, such as the fat signals. Accordingly, deterioration in SNRs of metabolite signals, such as fat signals, due to the eddy current correction can be avoided. As a matter of course, when the MR signals for the MRS analysis have been acquired by a sequence by which the MR signal component from water is completely suppressed, the deterioration in SNRs of metabolite signals, such as fat signals, due to the eddy current correction can be also avoided.

Note that, the correction for removing unnecessary metabolite signals, such as fat signals, from the data for the eddy current correction may be omitted in the flow chart shown in FIG. 7 since the unnecessary metabolite signals have been saturated by the pre-scan.

Figure 8:
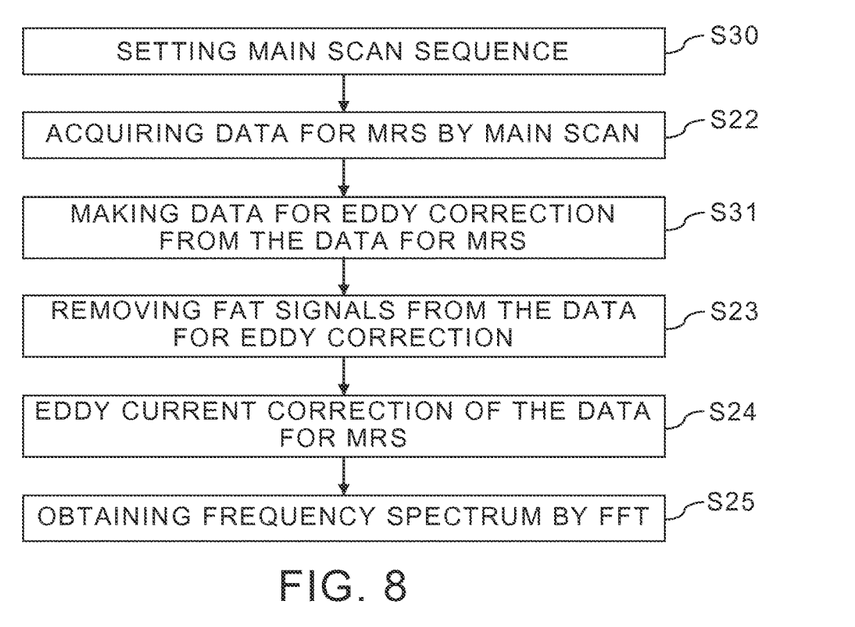
FIG. 8 is a flow chart showing another example of an operation of the magnetic resonance imaging apparatus shown in FIG. 1.

FIG. 8 is a flow chart showing another example of an operation of the magnetic resonance imaging apparatus 20 shown in FIG. 1. In FIG. 8, same signs are attached with steps similar to those in FIG. 7, and detailed explanations thereof are omitted.

MR signals themselves for an MRS analysis can also be used for data for an eddy current correction in the MRS analysis. In that case, a pre-scan for acquiring reference data for the eddy current correction is unnecessary.

Therefore, in step S30, a sequence by which MR signal component from water remains or a sequence by which the MR signal component from water is completely suppressed is set as a sequence for a main scan by the data acquiring condition setting part 40. When the sequence by which the MR signal component from water remains is set, a sequence which performs an incomplete water saturation as exemplified in FIG. 3 (A) or a sequence which does not perform the water saturation as exemplified in FIG. 4 (A) is set as the sequence for the main scan.

Next, in step S22, the main scan is performed according to the sequence for the main scan. MR signals for the MRS analysis acquired by the main scan are given to the eddy current correction part 41B.

Next, in step S31, the eddy current correction part 41B extracts at least a part of the MR signals for the MRS analysis as the data for the eddy current correction. Then, in step S23, a correction for removing an influence of unnecessary metabolite signals, such as fat signals, is performed to the data for the eddy current correction. Subsequently, in step S24, the eddy current correction of the MR signals for the MRS analysis is performed using the data for the eddy current correction after the correction. Finally, in step S25, a frequency spectrum of the MR signals can be generated by an FFT.

The frequency spectrum generated as described above is based on the MR signals which have been subjected to the eddy current correction using the data for the eddy current correction subjected to the correction for removing the influence of the unnecessary metabolite signals, such as the fat signals. Therefore, as well as when a water saturation effect in MR signals which are a generation target of a frequency spectrum is complete, even when the water saturation effect in the MR signals is not complete, deterioration in SNRs of the MR signals in the frequency spectrum can be avoided.

That is, the magnetic resonance imaging apparatus 20 as mentioned above is configured to be able to perform an eddy current correction of MR signals for an MRS analysis using data for a correction in which unnecessary metabolite signals, such as fat signals and/or silicone signals, have been removed or suppressed.

Therefore, according to the magnetic resonance imaging apparatus 20, it is possible to avoid deterioration in SNRs of necessary metabolite signal component, resulting from unnecessary metabolite signal component included in data for an eddy current correction, in an MRS analysis with an eddy current correction of MR signals.

Figure 9:
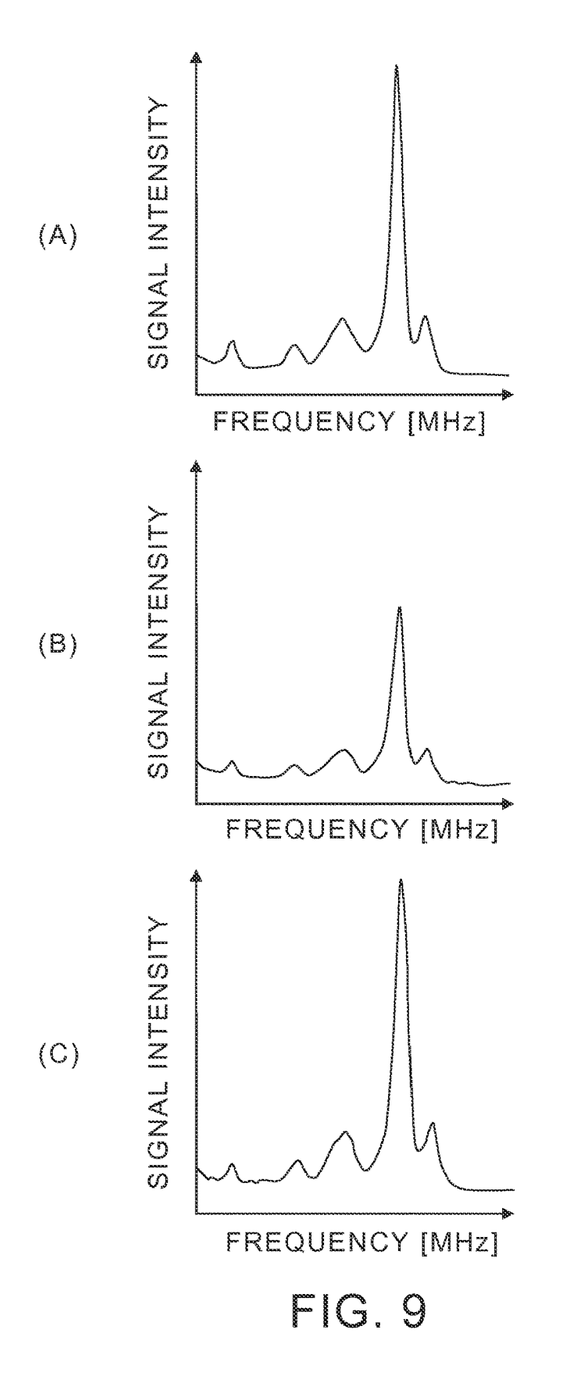
FIG. 9 shows an effect of the magnetic resonance imaging apparatus shown in FIG. 1.

FIG. 9 shows an effect of the magnetic resonance imaging apparatus 20 shown in FIG. 1.

In FIG. 9, each horizontal axis shows a frequency, and each vertical axis shows signal intensity. Each of (A), (B), and (C) in FIG. 9 shows a frequency spectrum of MR signals acquired without a water saturation, from a phantom including water and fat. FIG. 9 (A) shows a frequency spectrum of MR signals generated without an eddy current correction. FIG. 9 (B) shows a frequency spectrum of MR signals generated by performing the conventional eddy current correction without a correction of data for an eddy current correction. FIG. 9 (C) shows a frequency spectrum of MR signals generated by performing an eddy current correction with a correction of data for an eddy current correction.

When MR signals are acquired without a water saturation and a frequency spectrum of the MR signals is generated by performing the conventional eddy current correction without a correction of data for an eddy current correction, SNRs of fat signals deteriorate as shown in FIG. 9 (B). On the contrary, when a correction for removing fat signals from data for an eddy current correction is performed, deterioration in SNRs of fat signals in a frequency spectrum can be avoided as shown in FIG. 9 (C).

Note that, when an eddy current gives a large influence, SNRs of fat signals may also deteriorate in a frequency spectrum generated without an eddy current correction. In such a case, SNRs of fat signals in a frequency spectrum can be improved by an eddy current correction based on data, for the eddy current correction, corrected by removing fat signal component.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus that obtains an eddy current corrected frequency spectrum, said apparatus comprising a computer configured to:
    acquire first magnetic resonance (MR) signals by magnetic resonance spectroscopy (MRS), the first MR signals to be used for MRS analysis; and
    apply an eddy current correction to the first MR signals, the eddy current correction also using second MR signals from which an influence of a predetermined metabolite has been removed, the second MR signals having been acquired in a separate MR pulse sequence or derived from said first MR signals and said predetermined metabolite including at least one of fat and/or silicone; and
    obtain a frequency spectrum of the first MR signals with a Fourier Transformation after the eddy current correction has been applied, the resulting frequency spectrum having an improved signal-to-noise ratio.

2. The magnetic resonance imaging apparatus of claim 1, wherein said computer is further configured to:
   acquire the first MR signals under a condition where a MR signal component from water remains; and
   perform correction processing in order to remove an influence of a MR signal component from a second metabolite, which is different from the first metabolite.

3. The magnetic resonance imaging apparatus of claim 2, wherein said computer is further configured to acquire the MR signals for the analysis under a condition that the MR signal component from water is suppressed incompletely or a condition that the MR signal component from water is not suppressed.

4. The magnetic resonance imaging apparatus of claim 1, wherein said computer is further configured to
   acquire the MR signals for the analysis under a condition that a MR signal component from water is completely suppressed; and
   perform correction processing in order to remove an influence of a MR signal component from a second metabolite, which is different from the first metabolite.

5. The magnetic resonance imaging apparatus of claim 2, wherein said computer is further configured to perform the correction processing by a phase correction, subtraction processing and a phase inverse correction,
   the phase correction changing a center frequency of the MR signals for the eddy current correction into a center frequency of the MR signal component from the first metabolite,
   the subtraction processing extracting and subtracting the MR signal component from the first metabolite, from the MR signals for the eddy current correction after the phase correction,
   the phase inverse correction shifting the center frequency of the MR signals for the eddy current correction after the subtraction processing to a center frequency of the MR signal component from the first metabolite.

6. The magnetic resonance imaging apparatus of claim 2, wherein said computer is further configured to perform the correction processing by
   extracting the MR signal component corresponding to the first metabolite, from the MR signals for the eddy current correction, and
   using the extracted MR signal component from the first metabolite, as the MR signals for the eddy current correction after the correction processing.

7. The magnetic resonance imaging apparatus of claim 1, wherein said computer is configured to acquire the MR signals for the eddy current correction in addition to acquiring the MR signals for the analysis.

8. The magnetic resonance imaging apparatus of claim 1, wherein said computer is configured to use the MR signals for the analysis as the MR signals for the eddy current correction.

9. A magnetic resonance imaging (MRI) apparatus that obtains an eddy current corrected frequency spectrum, said apparatus comprising a computer configured to:
   acquire (a) first magnetic resonance (MR) signals by magnetic resonance spectroscopy (MRS) and (b) second MR signals, the first MR signals to be used for MRS analysis, the second MR signals being used for eddy current correction and acquired under condition that a predetermined metabolite is suppressed, said predetermined metabolite comprising at least one of fat and/or silicone; and
   obtain a frequency spectrum of the first MR signals with a Fourier Transform after using the MR signals for eddy current correction of the first MR signals, the resulting frequency spectrum having an improved signal-to-noise ratio.

10. The magnetic resonance imaging apparatus of claim 9, wherein said computer is further configured to acquire the MR signals for the analysis under a condition that a MR signal component from a first metabolite remains and acquire the MR signals for the eddy current correction under a condition that a MR signal component from a second metabolite is suppressed, said second metabolite comprising at least one of fat and silicone and which is different from the first metabolite.

11. The magnetic resonance imaging apparatus of claim 10, wherein said computer is further configured to acquire the MR signals for the analysis under a condition that the MR signal component from water is suppressed incompletely or a condition that the MR signal component from water is not suppressed.

12. The magnetic resonance imaging apparatus of claim 9, wherein said computer is further configured to acquire the MR signals for the analysis under a condition that a MR signal component from water is completely suppressed and acquire the MR signals for the eddy current correction under a condition that a MR signal component from a second metabolite is suppressed, said second metabolite being at least one of fat and silicone different from the first metabolite.

* * * * *